(12) United States Patent
See

(10) Patent No.: US 10,095,435 B1
(45) Date of Patent: Oct. 9, 2018

(54) METHODS FOR INITIALIZING MEMORY DEVICES

(71) Applicant: Altera Corporation, San Jose, CA (US)

(72) Inventor: Chin Liang See, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/887,822

(22) Filed: Oct. 20, 2015

Related U.S. Application Data

(60) Provisional application No. 62/101,842, filed on Jan. 9, 2015.

(51) Int. Cl.
*G06F 12/00* (2006.01)
*G06F 3/06* (2006.01)

(52) U.S. Cl.
CPC .......... *G06F 3/0632* (2013.01); *G06F 3/0619* (2013.01); *G06F 3/0673* (2013.01)

(58) Field of Classification Search
None
See application file for complete search history.

(56) References Cited

U.S. PATENT DOCUMENTS

| | | | |
|---|---|---|---|
| 5,848,367 A | 12/1998 | Lotocky et al. | |
| 6,381,715 B1 * | 4/2002 | Bauman | G11C 29/26 365/201 |
| 7,225,278 B1 | 5/2007 | Baxter et al. | |
| 7,370,186 B1 * | 5/2008 | Lilliebjerg | G06F 9/4401 713/1 |
| 8,108,571 B1 | 1/2012 | Bouvier | |
| 8,316,158 B1 | 11/2012 | Wright et al. | |
| 8,548,900 B1 | 10/2013 | Glackin et al. | |
| 8,621,193 B2 | 12/2013 | Erforth et al. | |
| 2003/0009654 A1 * | 1/2003 | Nalawadi | G06F 9/4401 713/1 |
| 2007/0263443 A1 * | 11/2007 | Crook | G11C 7/20 365/185.08 |
| 2012/0084547 A1 * | 4/2012 | Jung | G06F 9/4406 713/2 |
| 2012/0311240 A1 * | 12/2012 | Kato | G06F 9/4418 711/103 |

* cited by examiner

*Primary Examiner* — Baboucarr Faal
(74) *Attorney, Agent, or Firm* — Tianyi He

(57) ABSTRACT

In one embodiment, a method of operating memory circuitry that is coupled to processing circuitry and memory controller circuitry may include a step to initialize a first portion of the memory circuitry with the memory controller circuitry. The method may also include a step to store startup sequence information onto the first portion of the memory circuitry while the memory controller circuitry initializes a second portion of the memory circuitry with the processing circuitry. The second portion of memory circuitry may be different from the first portion of the memory circuitry.

17 Claims, 4 Drawing Sheets

METHODS FOR INITIALIZING MEMORY DEVICES

This application claims the benefit of provisional patent application No. 62/101,842, filed Jan. 9, 2015, which is hereby incorporated by reference herein in its entirety.

BACKGROUND

A system-on-chip (SOC) device is a device that includes two or more circuit systems (e.g., processing circuitry system and programmable gate array circuitry system) on a single chip. The SOC device, together with other circuits (e.g., a memory device), may perform a user specified function. The memory device may be utilized to store information transmitted from the SOC device.

However, a memory device is prone to single event upsets (SEUs). An SEU occurs when ions or electromagnetic radiation strikes the memory device. Such an event may alter the state of a memory bit on the memory device and generate a single bit error. Therefore, many SOC devices include error correction code (ECC) circuitry to overcome such errors.

The ECC circuitry, however, is unable to correct double bit errors. This is because double bit errors are generally caused by uninitialized memory in the device. Therefore, most memory devices that are coupled to SOC devices need to be initialized first before being used in any application.

The initialization of a memory device is generally a time-consuming operation. Conventional initialization methods often hold up the SOC device and delay the execution of other steps (e.g., loading boot-up information, etc.). Although there are initialization methods that perform parallelized initializations that help to reduce hold up time, these methods still do not allow the SOC device to continue executing other steps during the initialization stage.

SUMMARY

Embodiments described herein include methods of initializing a memory device and an initialization apparatus. It should be appreciated that the embodiments can be implemented in numerous ways, such as a process, an apparatus, a system, a device, or a method. Several embodiments are described below.

In one embodiment, a method of operating memory circuitry is disclosed. The memory circuitry is coupled to processing circuitry and memory controller circuitry. The method may include an operation to initialize a first portion of the memory circuitry with the memory controller circuitry. The method may also include an operation to store startup sequence information onto the first portion of the memory circuitry while the memory controller circuitry initializes the second portion of the memory circuitry with the processing circuitry. The second portion of memory circuitry may be different from the first portion of the memory circuitry.

In another embodiment, a method of operating a direct memory access (DMA) controller is disclosed. The DMA controller may be coupled to memory circuitry and processing circuitry. The method may include an operation to initialize a first portion of the memory circuitry using the DMA controller. In addition, the method may include an operation to initialize a second portion of the memory circuitry with the DMA controller while the first portion of the memory circuitry is being accessed by the processing circuitry. As stated in the embodiment above, the second portion of the memory circuitry may be different than the first portion of the memory circuitry.

In another embodiment, an initializing apparatus is disclosed. The initializing apparatus may include memory circuitry and memory controller circuitry. The memory controller circuitry may be coupled to the memory circuitry and may be utilized to initialize the memory circuitry in two stages.

Further features of the invention, its nature and various advantages will be more apparent from the accompanying drawings and the following detailed description of the preferred embodiments.

DETAILED DESCRIPTION

The following embodiments describe methods and an apparatus for initializing a memory device. It will be obvious, to one skilled in the art, that the present exemplary embodiments may be practiced without some or all of these specific details. In other instances, well-known operations have not been described in detail in order not to unnecessarily obscure the present embodiments.

Figure 1:
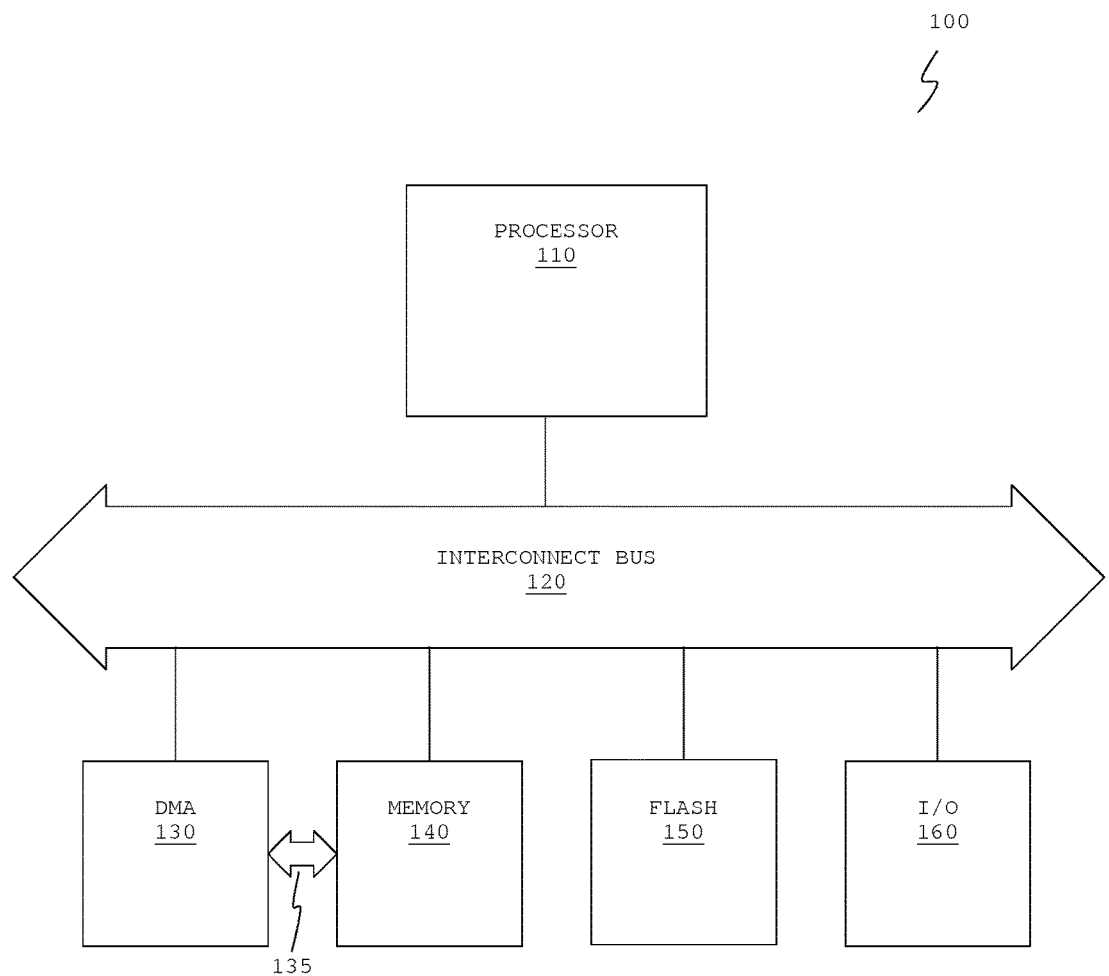
FIG. 1 shows an illustrative circuit system in accordance with one embodiment of the present invention.

FIG. 1, meant to be illustrative and not limiting, illustrates a circuit system in accordance with one embodiment of the present invention. Circuit system 100 includes processing circuitry 110, interconnect bus circuitry 120, direct memory access (DMA) circuitry 130, memory circuitry 140, flash circuitry 150 and input/output (I/O) circuitry 160.

Circuit system 100 may be a part of a telecommunication system, a computer system or an automotive system. In one exemplary embodiment, circuit system 100 may be a part of a computer system that processes video signals for a computer monitor or keyboard keystrokes of the computer system. In another exemplary embodiment, circuit system 100 may be a part of a telecommunication system that processes data received from a user in a telecommunication network.

In one embodiment, circuit system 100 may be implemented entirely on a programmable logic device (PLD) such as a field programmable gate array (FPGA) device. Therefore, processing circuitry 110, interconnect bus circuitry 120, DMA circuitry 130, memory circuitry 140, flash circuitry 150 and I/O circuitry 160 may be formed by configuring programmable logic elements within the PLD. Alternatively, circuit system 100 may be implemented on a printed circuit board (PCB) whereby each abovementioned circuitry may be a discrete device on the PCB.

It should be appreciated that there may be other circuits within circuit system 100 (e.g., an analog-to-digital (A/D) converter). The inclusion of any additional circuits may depend on the design requirements for the circuit system 100.

In the embodiment of FIG. 1, processing circuitry 110 may be coupled to DMA circuitry 130, memory circuitry 140, flash circuitry 150, and I/O circuitry 160 through interconnect bus circuitry 120. Each of these circuits may include a signal interface that is utilized to transmit and receive signals.

In one embodiment, processing circuitry 110 may be utilized to carry out instructions provided by a program (which includes a sequence of instructions for processing circuitry 110). Processing circuitry 110 may perform basic arithmetical, logical, and input/output operations of circuit system 100. Processing circuitry 110 may also control transactions that occur within circuit system 100. For example, processing circuitry 110 may transmit or retrieve information from memory circuitry 140. Alternatively, processing circuitry 110 may process an I/O signal received from I/O circuitry 160.

Referring still to FIG. 1, processing circuitry 110 may be a central processing unit (CPU), a microprocessor, a floating point co-processor, a graphics co-processor, a hardware controller, a microcontroller, a PLD configured as a controller, a network controller, or other processing units. Alternatively, processing circuitry 110 may be a system-on-chip (SOC) or a system-in-package (SiP) module.

It should be appreciated that a processor-centric system may include any number of processing circuits. For example, a quad-core processor system may include four processing circuitry coupled together by an interconnect bus circuitry in the circuit system. Alternatively, a highly-peripheral circuit system may have a large number of peripheral circuits (i.e., memory circuitry 140, flash circuitry 150, etc.) coupled to its processing circuitry (i.e., processing circuitry 110). An example of a highly-peripheral circuit system is a telecommunication system. However, most circuit systems are simple circuit systems with very few peripheral circuits coupled to its processing circuitry.

Direct memory access circuitry 130 may be able to facilitate access to a memory device. DMA circuitry 130 may be able to access memory circuitry (e.g., memory circuitry 140) independent of processing circuitry 110. In the embodiment of FIG. 1, DMA circuitry 130 may be coupled directly (i.e., bypassing interconnect bus circuitry 130) to memory circuitry 140 using interconnect 135. Interconnect 135 may include at least sixteen signal channels between memory circuitry 140 and direct memory controller circuitry 130, for example. These signal channels may be utilized to transmit information between memory circuitry 140 and direct memory controller circuitry 130. DMA controller circuitry 130 may be indirectly coupled to memory circuitry 140 through interconnect bus circuitry 120 if desired.

DMA circuitry 130 may access memory circuitry 140 at the request of processing circuitry 110. The request may include a command to initiate information transfer between DMA circuitry 130 and memory circuitry 140. In addition to the command, the request may also include a start memory address location and a count value, which represents the number of memory address locations to be addressed with the read/write operations from the start memory address location.

As the operations related to memory circuitry 140 are performed by DMA circuitry 130, processing circuitry 110 may be available to execute other operations (e.g., loading/processing other information). It should be appreciated that processing circuitry 110 may receive an interrupt signal from DMA circuitry 130 once DMA circuitry 130 concludes its access of memory circuitry 140.

Memory circuitry 140 forms a storage unit for circuit system 100. In one embodiment, information provided by processing circuitry 110 may be written to memory circuitry 140. Alternatively, memory circuitry 140 may provide information at the request of processing circuitry 110 (e.g., information may be read from circuitry 140).

In one embodiment, memory circuitry 140 may be a synchronous dynamic random access memory (SDRAM), double data rate synchronous dynamic random access memory (DDR SDRAM), double data rate two synchronous dynamic random access memory (DDR2 SDRAM), double data rate three synchronous dynamic random access memory (DDR3 SDRAM) or reduced latency dynamic random access memory (RLDRAM). Memory circuitry 140 may have a storage capacity greater than 1 gigabyte (GB), in one embodiment.

Flash circuitry 150, unlike memory circuitry 140, may be utilized to store startup information (e.g., boot-up information). In one embodiment, where processing circuitry 110 is a system-on-chip that includes an embedded processor and a programmable logic fabric that surrounds the embedded processor, flash circuitry 150 may include configuration information for the programmable logic fabric. Flash circuitry 150 may also store initialization information (e.g., instructions to initialize I/O circuitry 160 and load operating system).

Referring still to FIG. 1, I/O circuitry 160 may be utilized to transmit signals in and/or out of circuit system 100. In a telecommunication system, I/O circuitry 160 may be utilized to receive user information from a user and to transmit the user information to another user. I/O circuitry 160 may be transceiver circuitry, in one embodiment.

Figure 2:
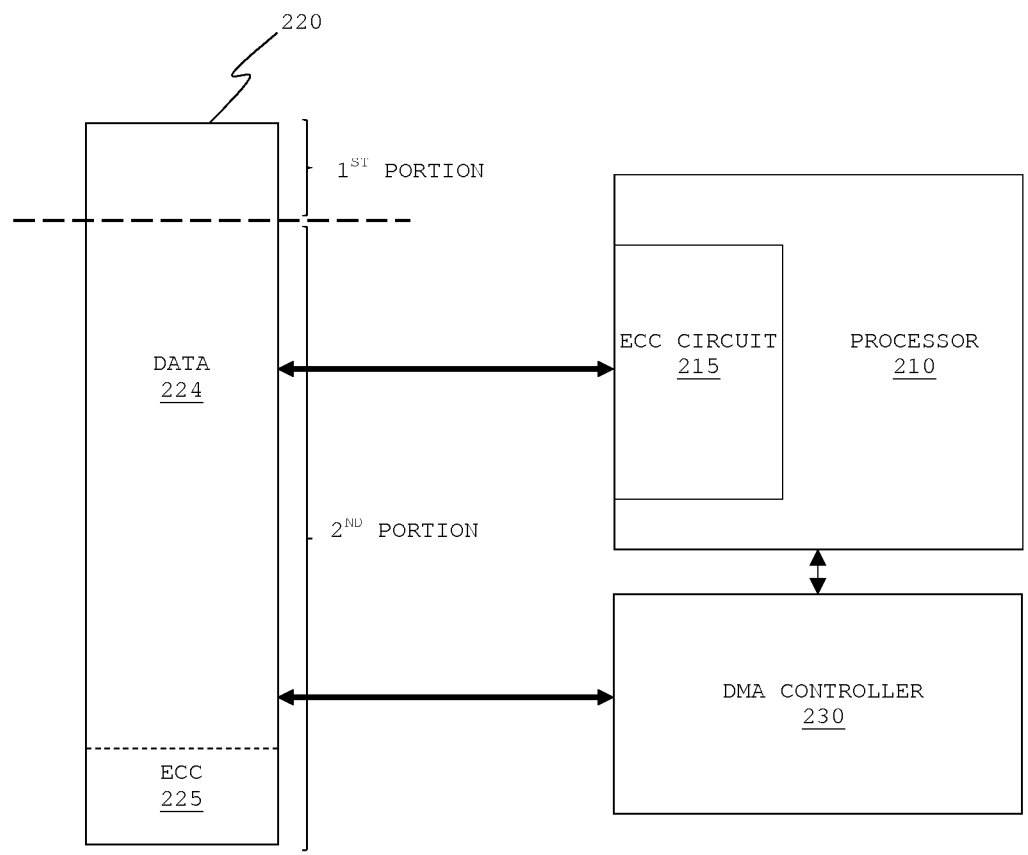
FIG. 2 shows an illustrative apparatus for initializing memory circuitry in accordance with one embodiment of the present invention.

FIG. 2, meant to be illustrative and not limiting, illustrates an apparatus for initializing memory circuitry in accordance with one embodiment of the present invention. Processing circuitry 210 may be similar to processing circuitry 110 of FIG. 1, for example.

As shown in the embodiment of FIG. 2, processing circuitry 210 may include error correction code (ECC) circuit 215. ECC circuit 215 may detect errors from data read from memory circuitry 220. When ECC circuit 215 detects any error, ECC circuit 215 may also be operable to correct the errors in the data if desired. Hence, ECC circuit 215 may be used for ensuring that the circuit system (e.g., circuit system 100 of FIG. 1) is error-free.

Prior to transmitting data to memory circuitry 220 for storage, ECC circuit 215 may generate an error correction code for that data. It should be appreciated that the error correction code may be generated with a common error correction and code algorithm, such as, Hamming code.

Before processing any data that is read from memory circuitry 220, ECC circuit 215 may compare an error correction code generated directly from the data that was read from memory circuitry 220 and the error correction code read from memory circuitry 220. When the two error correction codes do not match, the data may include errors. ECC circuit 215 may notify processing circuitry 210 that there is an error in the data read from memory circuitry 220. Processing circuitry 210 may then correct the erroneous data if possible. Alternatively, when the two error correction codes match, the retrieved data does not include any errors. It should be appreciated that the algorithm utilized to generate an error correction code for the data that was read from memory circuitry 220 may be identical to the algorithm that was utilized to generate an error correction code for the data prior to the data being transmitted from processing circuitry 210 to memory circuitry 220.

Processing circuitry 210 may be coupled to memory circuitry 220. In one embodiment, memory circuitry 220 may be similar to memory circuitry 140 of FIG. 1. As shown in the embodiment of FIG. 2, memory circuitry 220 is separated into two segments (data segment 224 and error-correction code segment 225). Data segment 224 may be utilized to store data information that is transmitted by processing circuitry 210. Error-correction code segment 225 may be utilized to store the error-correction code generated by ECC circuit 215 (prior to transmitting to memory circuitry 220). In one embodiment, the capacity for data segment 225 may be 1 GB and the capacity for error-correction code segment 225 may be 256 megabyte (MB).

If desired, memory circuitry 220 may be divided into two or more portions (e.g., shown in FIG. 2 as a first portion and a second portion). Such divisions are generally predetermined by a system designer. The first portion of memory circuitry 220 may be utilized to store startup information (e.g., boot-up information). In one embodiment, the startup information may be the operating software. The second portion of memory circuitry 220 may be utilized when a user is using the circuit system. Therefore, it should be appreciated that the second portion is not immediately used once the circuit system starts.

In one embodiment, memory circuitry 220 may be initialized in two stages. Both stages may be performed by direct access memory (DMA) controller 230 at the request of processing circuitry 210. The first stage includes initializing the first portion of memory circuitry 220. In one embodiment, the initializing process may include writing logic low signals into bits that form the first portion of memory circuitry 220. Once the first stage finishes, processing circuitry 210 may request DMA controller 230 to initialize the second portion of memory circuitry 220. Similar to the first stage, the second stage may also include writing logic low signals into bits that form the second portion of memory circuitry 220.

During the second stage, processing circuitry 210 may receive startup information from flash circuitry (e.g., flash circuitry 150 of FIG. 1) and may start to write startup information into the first portion of memory circuitry 220. It should be appreciated that retrieving the startup information from the flash circuitry is generally a time consuming process. Therefore, performing the step to retrieve the startup information in parallel with initialization of memory circuitry 220 may significantly speed up readiness of circuit system (e.g., circuit system 100).

Once the startup information is written, processing circuitry 210 may also execute the steps in the startup information. Therefore, the second stage of initialization may be performed simultaneously with the writing and/or executing of the startup information. Performing the initialization together with the execution of the startup information simultaneously may be referred to herein as "parallel initialization" of memory circuitry 220. As an example, the first and second stages of the initialization may take a total time of 1.5 seconds.

Figure 3:
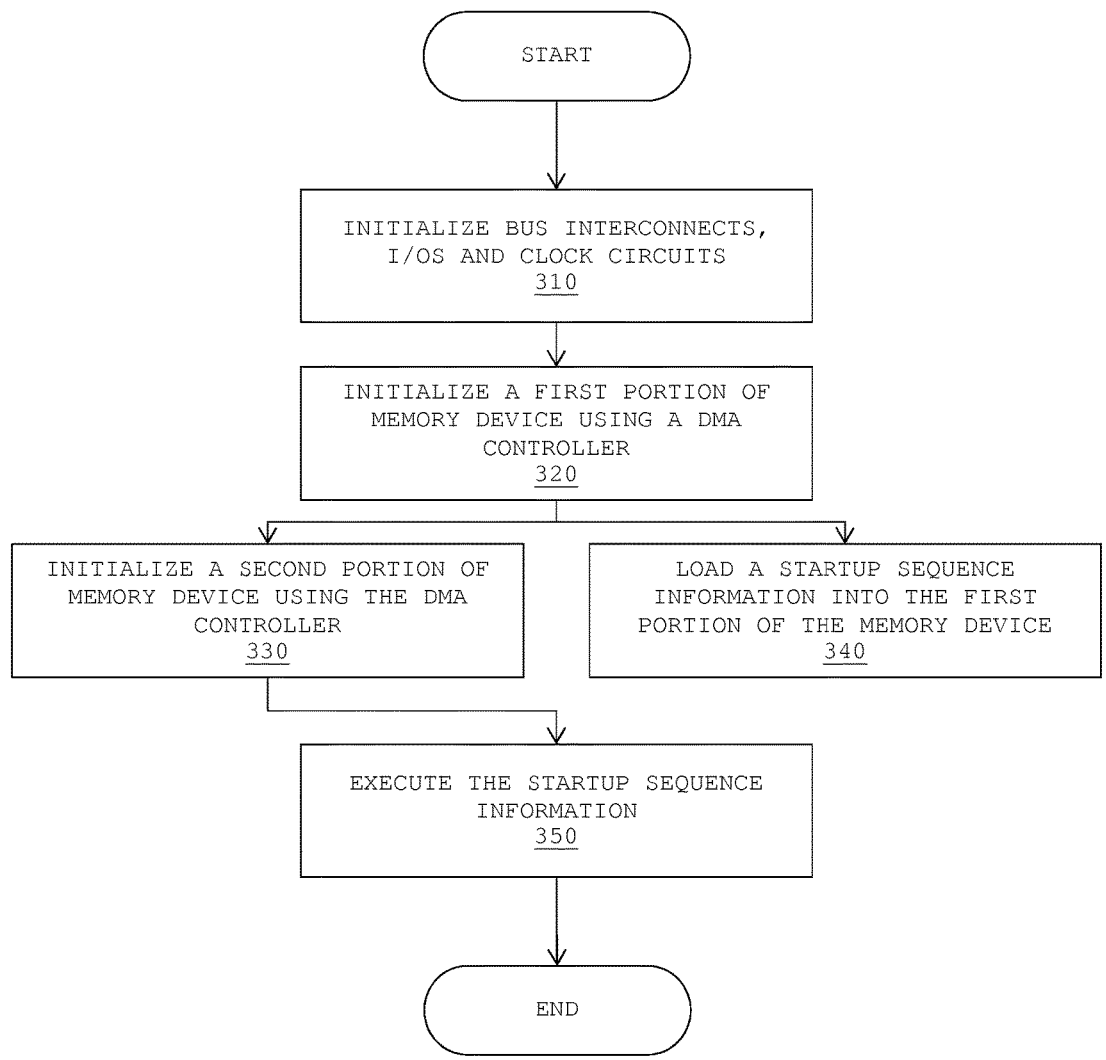
FIG. 3 shows an illustrative flowchart of a method to initialize a memory circuit in parallel in accordance with one embodiment of the present invention.

FIG. 3, meant to be illustrative and not limiting, shows a flowchart of a illustrative steps that may be performed to initialize memory circuitry in parallel in accordance with one embodiment of the present invention. In one embodiment, the memory circuitry may be similar to memory circuitry 130 of FIG. 1 or memory circuitry 220 of FIG. 2. The parallel initialization may be similar to the initialization steps described above with reference to FIG. 2.

At step 310, bus interconnect circuitry, I/O circuitry and clock circuitry may be initialized. In one embodiment, bus interconnect circuitry and I/O circuitry may be similar to bus interconnect circuitry 120 and I/O circuitry 160, respectively, of FIG. 1. Clock circuitry may form part of processing circuitry (e.g., processing circuitry 110 of FIG. 1 or processing circuitry 210 of FIG. 2).

At step 320, a first portion of memory circuitry may be initialized using a DMA controller. In one embodiment, the DMA controller may be similar to DMA circuitry 130 of FIG. 1 or DMA circuitry 230 of FIG. 2. The memory circuitry may be similar to memory circuitry 140 of FIG. 1 or memory circuitry 220 of FIG. 2. The first portion of memory circuitry may be similar to the first portion memory circuitry 220 of FIG. 2. The DMA controller, upon receiving a request from processing circuitry (e.g., processing circuitry 110 of FIG. 1 or processing circuitry 210 of FIG. 2), may start to initialize the memory circuitry.

The request may include information such as: (i) a starting memory address in the memory circuitry, (ii) a count value that indicates the number of memory addresses that will be addressed from the starting memory address location, (iii) the type of operation to be performed on these memory locations (e.g., a write operation in the case of initialization), and (iv) the logic value that is to be written on these locations. In one embodiment, the initialization process may be performed by writing a logic low signal into each bit forming the first portion of the memory circuitry. The storage capacity for the first portion of memory circuitry may be less than 16 MB, for example.

At step 330, a second portion of the memory circuitry may be initialized using the DMA controller. In one embodiment, the second portion may be a remaining portion of the memory circuitry (e.g., the second portion of memory circuitry 220 of FIG. 2). The second portion of the memory circuitry may have a storage capacity of 1 GB. Similar to step 320, the second portion of the memory circuitry may be initialized by writing a logic low signal into each bit forming the second portion of the memory circuitry.

At step 340, which is processed in parallel with (e.g., concurrently with) step 330, startup information may be written into the first portion of memory circuitry. In one embodiment, the startup information may be similar to operating system information as mentioned in FIG. 2. In one embodiment, the startup information is written into the memory circuitry by the processing circuitry (e.g., processing circuitry 110 or 210 of the respective FIGS. 1 and 2). In one embodiment, the startup information may be read from flash circuitry (e.g., flash circuitry 150 of FIG. 1). The startup information that was read from the flash circuitry may be transmitted to the first portion of memory circuitry using the bus interconnect circuitry (e.g., bus interconnect circuitry 120 of FIG. 1). As an example, steps 320, 330 and 340 may be executed in less than 2 seconds.

At step 350, the startup information in the second portion of memory circuitry may be executed by the processing circuitry. In one embodiment, the startup information may include multiple steps, which are executed sequentially.

Figure 4:
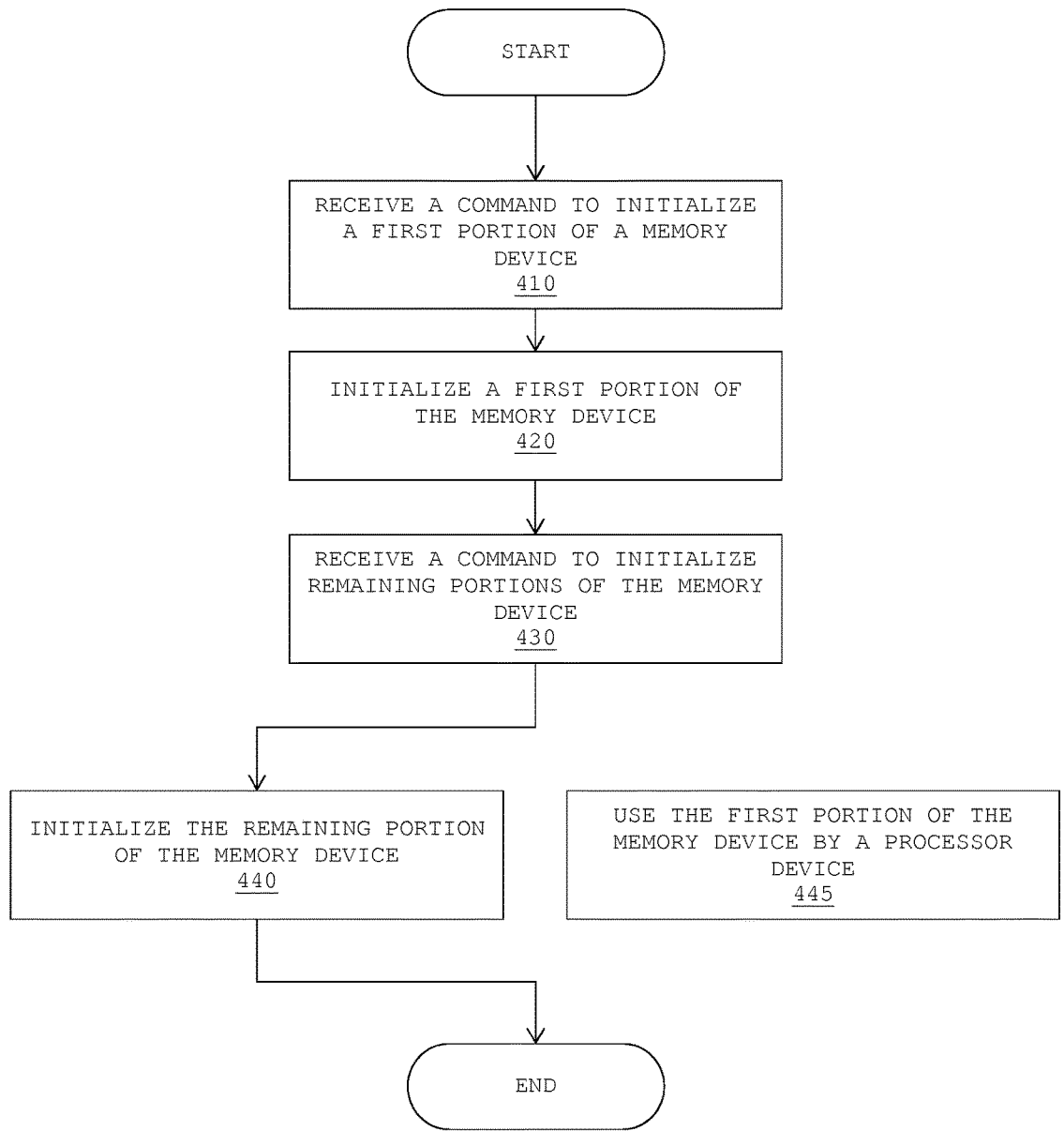
FIG. 4 shows an illustrative flowchart of a method to initialize memory circuitry using a direct memory access controller in accordance with one embodiment of the present invention.

FIG. 4, meant to be illustrative and not limiting, shows a flowchart of illustrative steps that may be performed by a DMA controller to initialize memory circuitry in accordance with an embodiment of the present invention. Similar to the method in FIG. 3, the DMA controller may be similar to DMA circuitry 130 or 230 of respective FIGS. 1 and 2, and the memory circuitry may be similar to memory circuitry 120 or 220 of respective FIGS. 1 and 2. The DMA controller and the memory circuitry may form part of a circuit system (e.g., circuit system 100 of FIG. 1).

At step 410, a DMA controller may receive a command to initialize a first portion of memory circuitry. The first portion of memory circuitry may be similar to the first portion memory circuitry 220 of FIG. 2. The command may include information such as: (i) a starting memory address location of the first portion of the memory circuitry, (ii) a count value that indicates the number of memory address locations that are to be addressed from the starting address location within the first portion of the memory circuitry, (iii) the type of operation to be performed on these memory address locations (e.g., a write operation in the case of initialization), and (iv) the logic value that is to be written to these locations.

At step 420, the DMA controller may initialize the first portion of memory circuitry. In one embodiment, the initialization process may be performed by writing a logic low signal to the bits forming the first portion of memory device.

At step 430, the DMA controller may receive another command to initialize a remaining portion of the memory circuitry. In one embodiment, the second portion may be the remaining portion of the memory circuitry (e.g., the second portion of memory circuitry 220 of FIG. 2). Similar to step 410, the command may include information such as: (i) a starting memory address on the second portion of the memory circuitry, (ii) a count value that indicates the number of memory address locations to be addressed from the starting memory address locations within the second portion of the memory circuitry, (iii) the type of operation to be performed on these memory locations (e.g., a write operation in the case of initialization), and (iv) the logic value that is to be written to these locations.

At step 440, the DMA controller may initialize the remaining portion of memory circuitry. Similar to step 420, the second portion of the memory device may be initialized by writing a logic low signal into each bit forming the second portion of the memory circuitry.

At step 445, which may be executed in parallel with step 440, processing circuitry may use the first portion of the memory circuitry. For example, processing circuitry may use the first potion of the memory circuitry to load startup information (e.g., operating system, etc.). In addition, the processing circuitry may then execute steps in the loaded startup information. In one embodiment, the processing circuitry may be similar to processing circuitry 110 or 210 of respective FIG. 1 or 2. The processing circuitry may write startup information into the first portion of the memory circuitry, in one embodiment. It should be appreciated that the steps 410 to 440/445 may be completed in less than 2 seconds.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of operating memory circuitry coupled to processing circuitry and direct memory access (DMA) memory controller circuitry, the method comprising:
    with the DMA memory controller circuitry, initializing a first portion of the memory circuitry; and
    with the processing circuitry, storing startup sequence information onto the first portion of the memory circuitry while the DMA memory controller circuitry initializes a second portion of the memory circuitry that is different from the first portion of the memory circuitry, wherein the memory controller circuitry initializes the second portion of the memory circuitry by transmitting a set of predefined memory initialization signals to the second portion of the memory circuitry.

2. The method as defined in claim 1, wherein initializing the first portion of the memory circuitry comprises:
    transmitting a predefined logic signal to each bit of the first portion of the memory circuitry.

3. The method as defined in claim 1, wherein the startup sequence information comprises boot-up information.

4. The method as defined in claim 1, wherein the first portion of the memory circuitry has a size that is larger than a size of the startup sequence information.

5. The method as defined in claim 1, wherein the first portion of the memory circuitry has a first size and the second portion of the memory circuitry has a second size that is larger than the first size.

6. The method as defined in claim 1, further comprising:
    with the DMA memory controller circuitry, initializing the second portion of the memory circuitry prior to initializing the first portion of the memory circuitry.

7. The method as defined in claim 1, further comprising:
with the processing circuitry, executing the startup sequence information stored on the first portion of the memory circuitry after the second portion of the memory circuitry has been initialized by the DMA memory controller circuitry.

8. A method of operating a direct memory access (DMA) controller coupled to memory circuitry and processing circuitry, the method comprising:
with the DMA controller, initializing a first portion of the memory circuitry; and
with the DMA controller, initializing a second portion of the memory circuitry that is different from the first portion of the memory circuitry while the first portion of the memory circuitry is being accessed by the processing circuitry, wherein initializing the second portion of the memory circuitry comprises transmitting memory initialization signals to the second portion of the memory circuitry before storing system data at the second portion of the memory circuitry.

9. The method as defined in claim 8, wherein the first portion of the memory circuitry has a first capacity that is less than a second capacity of the second portion of the memory circuitry.

10. The method as defined in claim 8, wherein the processing circuitry comprises a device selected from the group of devices consisting of: a microprocessor device, a field programmable gate array (FPGA) device, and a system-on-chip (SOC) device.

11. The method as defined in claim 8, wherein initializing the first portion of the memory circuitry comprises transmitting a first logic signal to each bit that forms the first portion of the memory circuitry and wherein initializing the second portion of the memory circuitry comprises transmitting a second logic signal to each bit that forms the second portion of the memory circuitry.

12. The method as defined in claim 11, wherein the first logic signal is selected from the group of logic signals consisting of: a logic high signal and a logic low signal.

13. The method as defined in claim 8, wherein initializing the second portion of the memory circuitry comprises initializing the second portion of the memory circuitry after the first portion of the memory circuitry has been initialized.

14. The method as defined in claim 8, wherein the memory circuitry has a capacity that is greater than 1 gigabyte.

15. An initializing apparatus, comprising:
a memory device;
direct memory access (DMA) memory controller circuitry that is coupled to the memory device, wherein the DMA memory controller circuitry initializes the memory device in first and second stages; and
a processor circuit that is coupled to the memory device and the DMA memory controller circuitry, wherein the processor circuit transmits a startup sequence to a first portion of the memory device that is initialized during the first stage in parallel with an initialization of the second stage of the memory device that initializes an uninitialized portion of memory in the memory device before storing system data at the uninitialized portion of the memory.

16. The initializing apparatus as defined in claim 15, wherein a capacity of the first portion of the memory device is smaller than a capacity of a second portion of the memory device that is initialized during the second stage.

17. The initializing apparatus as defined in claim 15, wherein the processing circuitry further comprises:
error-correction circuitry that generates error correction information that is to be stored within the memory device.

* * * * *